United States Patent [19]
Iwai et al.

[11] Patent Number: 5,485,425
[45] Date of Patent: Jan. 16, 1996

[54] SEMICONDUCTOR MEMORY DEVICE HAVING REDUNDANT COLUMN AND OPERATION METHOD THEREOF

[75] Inventors: Hidetoshi Iwai, Ome; Masaya Muranaka, Akishima; Takumi Nasu, Tsuchiura; Shunichi Sukegawa, Ome, all of Japan

[73] Assignees: Hitachi, Ltd., Tokyo, Japan; Texas Instruments Incorporated, Dallas, Tex.

[21] Appl. No.: 375,727

[22] Filed: Jan. 20, 1995

Related U.S. Application Data

[63] Continuation of Ser. No. 82,958, Jun. 29, 1993, abandoned.

[30] Foreign Application Priority Data

Jun. 30, 1992 [JP] Japan .................................. 4-196603

[51] Int. Cl.$^6$ ............................................. G11C 7/00
[52] U.S. Cl. ........................................ 365/200; 365/230.08
[58] Field of Search .......................... 365/200, 230.01, 365/230.06, 231, 189.07, 185, 230.08

[56] References Cited

U.S. PATENT DOCUMENTS

| | | | |
|---|---|---|---|
| 4,051,354 | 9/1977 | Choate | 365/200 |
| 4,757,474 | 7/1988 | Fukushi et al. | 365/200 |
| 4,803,656 | 2/1989 | Takemae | 365/200 |
| 5,122,987 | 6/1992 | Kihara | 365/200 |
| 5,168,468 | 12/1992 | Magome et al. | 365/200 |

FOREIGN PATENT DOCUMENTS 1-303699  12/1989  Japan .

*Primary Examiner*—A. Zarabian
*Attorney, Agent, or Firm*—Antonelli, Terry, Stout & Kraus

[57] ABSTRACT

There is provided a semiconductor memory device having a redundant column. This memory device has a redundant column disposed in the direction of the Y-system address, a ROM accessed by using an X-system address, a Y-system address signal having a defective cell included in the cells therein being electrically written into the ROM, a comparator circuit for comparing a signal read out from this ROM with a Y-system address signal and outputting a coincidence signal upon coincidence, and a defect relieving circuit responsive to output of the coincidence signal from this comparator circuit to cause selection of the redundant column of Y system instead of the Y-system address selection device.

15 Claims, 7 Drawing Sheets

1

SEMICONDUCTOR MEMORY DEVICE HAVING REDUNDANT COLUMN AND OPERATION METHOD THEREOF

This is a continuation of application Ser. No. 08/082,958, filed Jun. 29, 1993 now abandoned.

BACKGROUND OF THE INVENTION

The present invention relates to semiconductor memory devices and, more particularly to a technique effective for relieving defects of a dynamic RAM (random access memory) of an increased storage capacity, for example.

In a defect relieving technique for semiconductor memory devices, a row or column (a word line or data line) including a defective bit is collectively replaced by a stand-by row or column (a stand-by word line or a stand-by data line). While such a defect relieving technique is effective when breaking of wire or short-circuit fault has occurred, it degrades the efficiency for random defects caused by silicon crystals. There is known a semiconductor memory device such as disclosed in JP-A-1-303699, having a defect relieving circuit in which a defective bit, specified as an intersection of a row and a column is replaced by a redundant bit prepared in a stand-by row or column in one-to-one correspondence.

The above described defect relieving circuit disclosed in JP-A-1-303699, can relieve random defects efficiently in a memory device having an extremely small storage capacity. However, it is not suitable to memory devices having large storage capacities, such as approximately 16 Mbits or 64 Mbits, which are now being developed. This is because outputs of a row decoder and a column decoder are supplied to a comparator circuit in order to detect a defective bit and are compared with the output of a ROM storing therein a defective address beforehand. Assuming now that the memory device has a storage capacity of 16 Mbits, for example, each of the row and column simply has 4096 decode outputs. In order to specify one defective cell in the ROM, 4096 fuses are required for each of the row and column. Since the comparator circuit makes as many signal comparisons as 8192 bits in total, it has an extremely large circuit scale. In this way, 8192 fuses, 8192 signal buses, and a comparator circuit making as many comparisons as 8192 bits are required for relieving only one defect bit.

In a dynamic RAM such as the above described dynamic RAM having 16 Mbits, the operation speed is lowered because of an increase in the number of memory cells connected to the word line and data line and power dissipation must thus be decreased. Therefore, the word line and data line are divided, and the RAM is formed by a plurality of memory mats, memory arrays, or memory blocks. Depending upon such division of the word line, the number of apparent decode outputs increases. In the above described defect relieving method, therefore, the number of fuses included in the ROM and the number of actual bits compared by the comparator circuit increase, resulting in a further increase of the circuit scale.

In order to decrease the circuit scale of the defect relieving method disclosed in the above described JP-A-1-303699, the present inventors thought of comparing address signals instead of decode outputs as described in JP-A-1-303699. This is because only 24 bits of information suffice in the case of comparing address signals even in dynamic RAMs having a large memory capacity, such as 16-Mbit dynamic RAMs. For specifying one defect cell, however, a ROM having 24 fuses and a comparator circuit for comparing the output

2 signal of this ROM with the above described address signal having 24 bits is still needed. For relieving random defects as described above, relieving several bits or so is, for all practical purposes meaningless. Actually, a capability of relieving at least 100 bits or so is needed. Even if a comparison method using address signals as described above is adopted, however, an extremely large number of fuses and a comparator circuit having an extremely large circuit scale would still be needed.

SUMMARY OF THE INVENTION

An object of the present invention is to provide a semiconductor memory device which achieves relief of random defects by using a small circuit scale.

The above described and other objects and novel features of the present invention will be apparent from the following description and attached drawings.

Outline of a representative aspect of the invention disclosed in the present application will now be described briefly. That is to say, access is made by using an address of an X system, and there is provided a ROM into which an address signal of a Y system having a defective cell therein is electrically written. A signal read out from this ROM is compared with the address signal of the Y system. Upon coincidence, a redundant circuit of the Y system is selected in place of a regular circuit of the Y system.

Since the ROM stores the address signal of a Y system having a defect, the above described means can reduce the number of elements. Furthermore, since the comparator circuit makes a comparison of only the address of the Y system and the comparator circuit can be used in common to all addresses of the Y system, the circuit scale can be significantly reduced.

DESCRIPTION OF THE PREFERRED EMBODIMENTS

Figure 6:
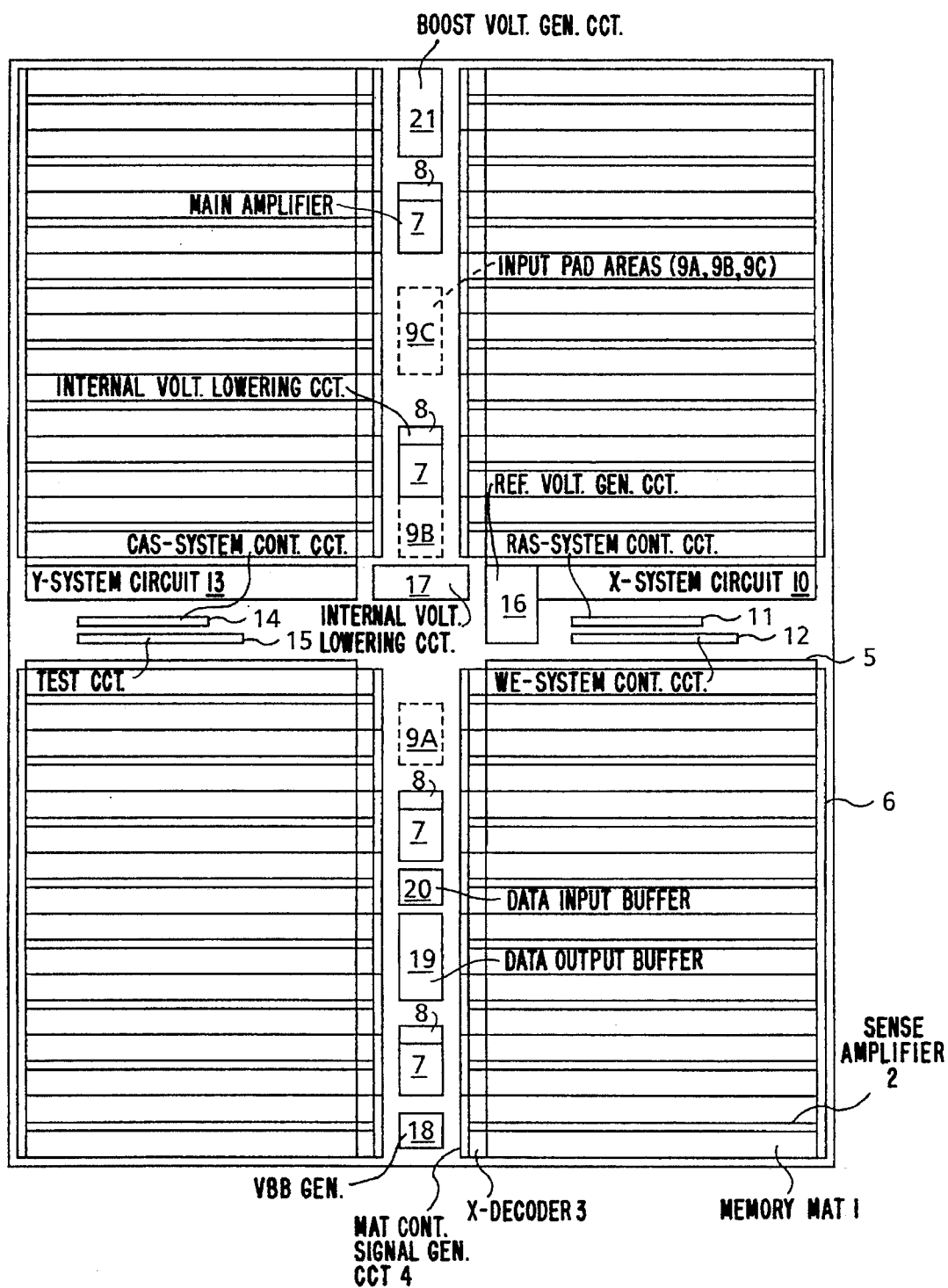
FIG. 6 is an entire block diagram showing an embodiment of a dynamic RAM whereto the present invention has been applied.

In FIG. 6, a block diagram of an embodiment of a dynamic RAM whereto the present invention has been applied is shown. Respective circuit blocks of FIG. 6 are formed on one semiconductor substrate such as monocrystalline silicon by using a known fabrication technique of semiconductor integrated circuits. Respective circuit blocks in FIG. 6 have been drawn according to the geometrical arrangement in an actual semiconductor chip. In the ensuing description, "MOSFET" is used to mean an insulated gate field effect transistor (IGFET).

In this embodiment, an arrangement of a memory array portion forming a RAM and a peripheral portion for making address selection of the memory array section are schemed so that there is prevented a lowering of the operation speed by elongated lengths of various kinds of wiring such as wiring of control signals and memory array drive signals resulting from an increase in chip size caused by a larger memory capacity.

With reference to FIG. 6, a cross-shaped area formed by a longitudinal central portion and a lateral central portion of a chip is provided. In this cross area, peripheral circuitry is mainly disposed. In the area divided into four parts by the cross-shaped area, memory arrays are disposed. That is to say, in the central portion of the chip in the longitudinal direction and lateral direction, a cross-shaped area is provided. In the area divided into four parts thereby, memory arrays are formed. Preferably, each of the above described four memory arrays is adapted to have a storage capacity of approximately 4 Mbits as described later. Accordingly, the four memory arrays as a whole have a large storage capacity of approximately 16 Mbits.

One memory mat 1 is disposed so that a word line may extend in the lateral direction and so that a pair of complementary data lines or bit lines disposed in parallel may extend in the longitudinal direction. As for the memory mat 1, a pair is disposed on the left and right of a sense amplifier 2. The sense amplifier 2 is used in common to a pair of memory mats 1 disposed on the left and right of the sense amplifier 2. That is to say, a so-called shared sense amplifier method is used. For each of the above described four memory arrays resulting from division, a Y selection circuit is provided on the central portion side. A Y selection line extends so that it may extend from the Y selection circuit 5 over a plurality of memory mats of the memory array corresponding to the Y selection circuit 5. The Y selection circuit is used to conduct switching control on the gate of a MOSFET for column switch of each memory mat.

In the right portion included in the central portion of the above described chip in the lateral direction, an X-system circuit 10 including an X redundant circuit and an X address driver (logical stage), an RAS-system control signal circuit 11, a WE-system signal control circuit 12, and a reference voltage generator circuit 16 are disposed. The reference voltage generator circuit 16 is disposed near the center of this area. The reference voltage generator circuit 16 receives an external power supply VCC such as approximately 5 V and forms a constant voltage VL corresponding to a voltage such as approximately 3.3 V supplied to the internal circuit.

In the left portion included in the central portion of the above described chip in the lateral direction, a Y-system circuit 13 including a Y-address buffer, a Y redundant circuit and a Y address driver (logical stage), a CAS-system control signal circuit 14, and a test circuit 15 are disposed. In the chip central portion thereof, an internal voltage lowering circuit 17 for forming a power supply voltage VCL for peripheral circuits such as address buffers and decoders is disposed.

If a redundant circuit including an address buffer and an address comparator circuit corresponding thereto, and the CAS-system control signal circuit for generating a control clock or the RAS-system control signal circuit are disposed so as to be concentrated at one place as described above, a clock generator circuit and other circuits are distributed so as to sandwich a wiring channel, for example, between them. In other words, the above described wiring channel is shared. As a result, higher integration becomes possible and signals can be transmitted to address drivers (logical stages) via the shortest and equal distances.

The RAS-system control circuit 11 is used to receive a signal RAS and activate the X address buffer. The address signal taken into the X address buffer is supplied to an X-system redundant circuit for conducting conventional defect relief while taking a word line as the unit. In the X-system redundant circuit, the address signal is compared with stored faulty addresses to determine whether changeover to the redundant circuit should be done. Its result and the above described address signal taken into the X address buffer are supplied to an X-system predecoder. In the X-system predecoder, a predecode signal is formed. Via X address drivers disposed so as to be associated with respective memory arrays, the predecode signal is supplied to respective X decoders 3 disposed so as to be associated with the memory mats as described before.

An internal signal of the above described RAS system is supplied to a control circuit of WE system and a control circuit of CAS system. On the basis of a decision on the input sequence of an RAS signal, a CAS signal, and a WE signal, for example, discrimination of an automatic refresh mode (CBR), test mode (WCBR) and the like is exercised. At the time of the test mode, the test circuit 15 is activated. In accordance with a specific address signal supplied at that time, a test function is set.

The control circuit 14 of the CAS system is used to receive the signal CAS and form various control signals of the Y system. The address signal taken into the Y address buffer in synchronism with a change of the signal CAS to a low level is supplied to a redundant circuit of the Y system for providing conventional defect relief with a data line taken as the unit. In the redundant circuit of the Y system, the address signal is compared with stored faulty addresses to determine whether changeover to the redundant circuit should be done. Its result and the above described address signal are supplied to a Y-system predecoder. In the Y-system predecoder, a predecode signal is formed. Via Y address drivers disposed so as to be respectively associated with four memory arrays, this predecode signal is supplied to respective Y decoders. On the other hand, the above described control circuit 14 of the CAS system reveives the RAS signal and the WE signal as described above. When the test mode is determined on the basis of decision on the input sequence of the RAS signal and the WE signal, the control circuit 14 of the CAS system activates the adjacent test circuit 15.

In the upper part of the central portion of the above described chip in the longitudinal direction, a total of 16 memory mats and 8 sense amplifiers are disposed so as to attain bilateral symmetry with respect to the center axis of this area. Corresponding to four sets of memory mats and sense amplifiers of each of the left and right sides among them, four main amplifiers 7 are provided. Besides these, a boost voltage generator circuit 21 for receiving the internal lowered voltage and selecting a word line, and input pad areas 9B and 9C corresponding to input signals such as the address signal and control signal are disposed in the upper part of the central portion in the longitudinal direction. Corresponding to memory blocks divided into the above described four sets of the left and right sides, internal voltage lowering circuits 8 for forming operation voltage of the sense amplifiers 2 are disposed.

In this embodiment, eight memory mats 1 and four sense amplifiers 2 are disposed in one block. A total of 16 memory mats 1 and a total of eight sense amplifiers 2 are assigned so as to attain bilateral symmetry with respect to the above described longitudinal axis. In this configuration, it is possible to transfer an amplified signal from each sense amplifier 2 to a main amplifier 7 via a short signal propagation path while using as few as four main amplifiers 7.

In the lower part of the central portion of the above described chip in the longitudinal direction, a total of 16 memory mats and 8 sense amplifiers are disposed so as to attain bilateral symmetry with respect to the center axis of this area. Corresponding to four sets of memory mats and sense amplifiers of each of the left and right sides among them, four main amplifiers 7 are provided.

Besides these, a substrate voltage generator circuit 18 for receiving the internal lowered voltage and forming negative substrate back bias voltage to be supplied to the substrate, an input pad area 9A corresponding to input signals such as the address signal and control signal, a data output buffer circuit 19, and a data input buffer circuit 20 are disposed in the lower part of the central portion in the longitudinal direction.

Corresponding to memory blocks divided into four sets of the left and right sides, internal voltage lowering circuits 8 for forming operation voltage of the sense amplifiers 2 are disposed in the same way as the foregoing description. Thereby, it is possible to transfer an amplified signal from each sense amplifier 2 to a main amplifier 7 via a short signal propagation path while using as few as four main amplifiers 7 in the same way as the foregoing description.

Although omitted in FIG. 6, various bonding pads in addition to the above described areas 9A to 9C are disposed in the above described central region in the longitudinal direction. As an example of these bonding pads, there are pads for external power supply. As for pads for providing the circuit ground potential in order to increase the input level margin, i.e., lower the power supply impedance, as comparatively many pads as a total of a dozen or so pads are so disposed as to nearly form a line. These pads for ground potential are connected to leads for ground potential extending in the longitudinal direction formed by the LOC technique.

These pads for grounding are provided mainly for the purpose of lowering the power supply impedance. For example, they are especially provided for preventing floating caused by clearing a word line and coupling of an unselected word line of a word driver, or they are provided as the common source of the sense amplifiers. Thereby, the power supply impedance of the circuit ground potential is lowered for the operation of the internal circuit. In addition, ground wiring between internal circuits divided into a plurality of kinds as described above is connected by a low-pass filter including an LOC lead frame and a bonding wire. Therefore, it is possible to suppress noise occurrence to a minimum and suppress propagation of circuit ground line noise between internal circuits to a minimum.

In the present embodiment, pads corresponding to the external power supply VCC such as approximately 5 V are disposed so as to correspond to each of the internal voltage lowering circuits 8 and 17 for conducting the above described voltage conversion operation. In the same way as the foregoing description, these pads also function to lower the power supply impedance and suppress noise propagation of voltage between internal circuits (between VCC, VDL, and VCC) to a low value.

Pads A0 to A11 for address inputting and pads RAS, CAS, WE and OE for control signal inputting are disposed in the above described areas 9A to 9C. Besides these, pads for data inputting and pads for data outputting are provided. Furthermore, the following pads are also provided for the purpose of bonding master, monitoring, and controlling the monitoring pads. As the pads for bonding master, there are pads for specifying the static column mode and pads for specifying the write mask function at the time of nibble mode and ×4 bit configuration. As pads for monitoring, there are pads for monitoring internal voltages VCL, VDL, VL, VBB, VCH, and VPL.

Among the internal voltages, VCL is a power supply voltage for peripheral circuits having a value of approximately 3.3 V, and it is formed in common by the internal voltage lowering circuit 17. VDL is power supply voltage supplied to memory arrays, i.e., sense amplifiers 2 having a value of approximately 3.3 V. In the present embodiment, four VDL pads are disposed so as to be associated with four memory blocks as described above. VCH is a boost power supply voltage for selecting the word line selection level and a shared switch MOSFET, which is generated by receiving the above described internal voltage VDL and boosting it to approximately 5.2 V. VBB is substrate back bias voltage such as −2 V. VPL is plate voltage of memory cells. VL is constant voltage supplied to the internal voltage lowering circuits 8 and 17 having a value of approximately 3.3 V.

Figure 1:
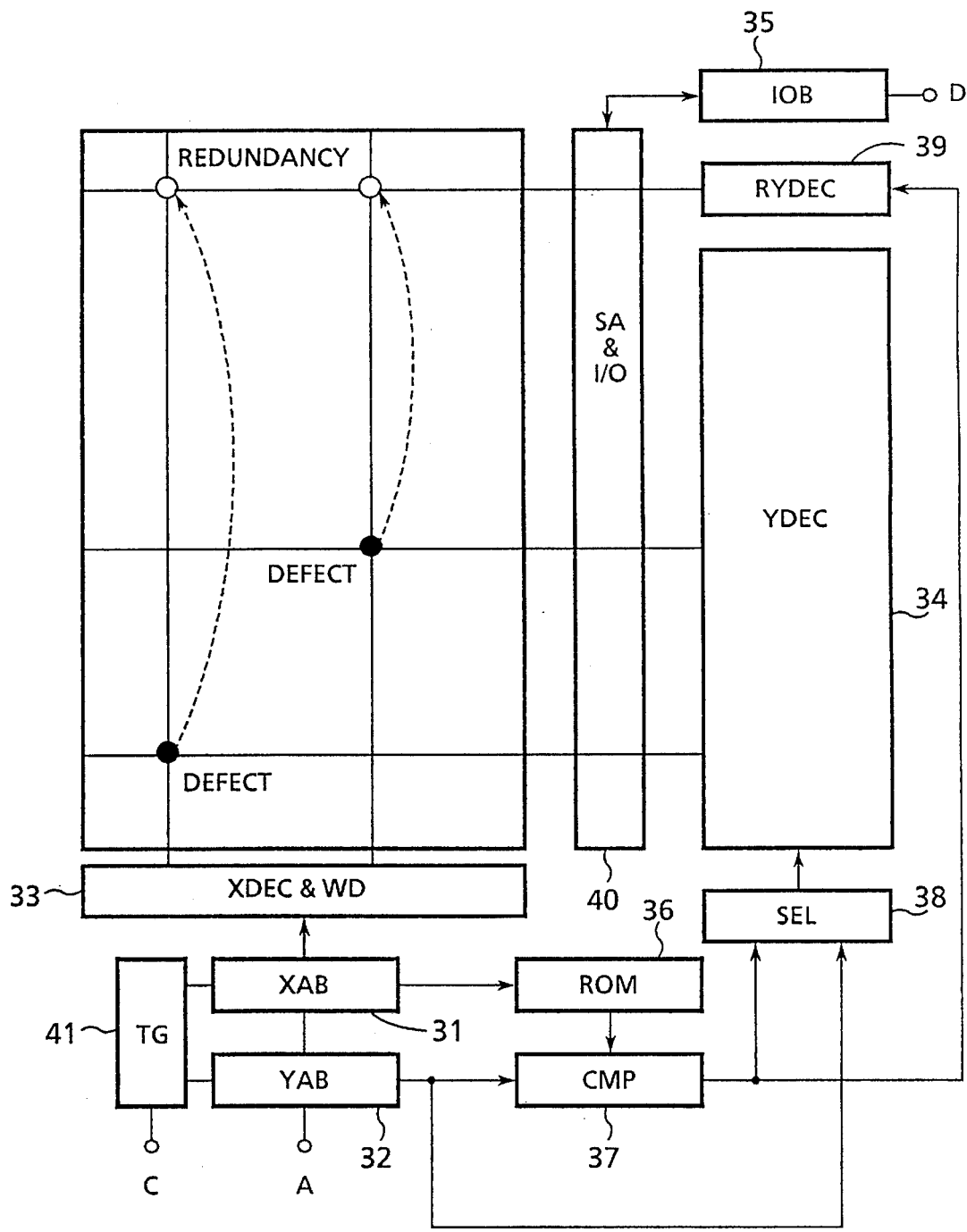
FIG. 1 is a block diagram showing an embodiment of a dynamic RAM having a random defect relieving function according to the present invention.

In FIG. 1, the block diagram of an embodiment of a dynamic RAM having a random defect relieving function according to the present invention is shown. In this embodiment, one memory array is included. As a matter of fact, however, the RAM is divided into a plurality of mats and blocks as shown in FIG. 6. Or it may be understood that FIG. 1 functionally represents one out of a plurality of memory arrays resulting from division and an address selection circuit thereof.

An X address buffer XAB 31 and a Y address buffer YAB 32 take in address signals, which are inputted in time series from an address terminal A, in accordance with address strobe signals RAS and CAS supplied from a control terminal C of a timing control circuit TG 41 in synchronism with the address signals. An X-system address signal taken in by the X address buffer XAB 31 in synchronism with the row address strobe signal RAS is inputted to an X decoder circuit XDEC 33. In the X decoder circuit XDEC 33, the address signal is decoded and one word line is selected via a word driver WD. A Y-system address signal taken in by a Y address buffer YAB 32 in synchronism with the column address strobe signal is inputted to a Y decoder circuit YDEC 34. In the Y decoder circuit YDEC 34, the address signal is decoded and a data line selection signal is formed. (To maintain simplicity and for purposes of discussion only one external address terminal, illustrated as external terminal A, is shown which is representative of plural such external address terminals for receiving a plural bit external address.)

In FIG. 1, signal lines are shown to extend from the Y decoder circuit YDEC 34 to the memory array. However, this aims at representing memory cells specified by the Y address. As a matter of fact, complementary data lines are disposed in the memory array. The complementary data lines are connected to an input-output line I/O via column switches. The Y decoder circuit YDEC 34 forms a selection signal for selecting the above described column switch.

The sense amplifier SA amplifies minute storage information read out on the above described complementary data line, and causes rewriting with respect to a memory cell having storage charge which has been about to be lost. In case the shared sense amplifier method is adopted as shown in FIG. 6, memory arrays or memory mats are disposed on the left and right of a sense amplifier 40.

The input-output line I/O is extended in the longitudinal direction and coupled to an input-output circuit IOB 35. The input-output circuit IOB 35 includes a main amplifier for reading operation, an output circuit, and an input circuit for writing operation. A terminal D is a data terminal used for outputting a read signal and inputting a write signal.

In this embodiment, a ROM 36 accessed by an X address signal and storing a Y address signal having a defective cell, a comparator circuit CMP 37 for comparing a Y address signal read out from the ROM 36 with an inputted Y address signal, a Y address signal selector SEL 38, and a redundant Y selection circuit RYDEC 39 are provided to relieve random defects. In the above described redundant Y selection circuit RYDEC 39, one redundant memory cell column is provided for one Y selection circuit.

Preferably, a nonvolatile memory element having a stacked gate structure which will be described later is used as the ROM 36. For each word line, the ROM 36 has addresses associated therewith. Storage data having as many bits as correspond to Y address signals are inputted and outputted in parallel. When one random defective cell exists on a specific word line, the Y address having a defective cell is stored in the ROM 36 at an address associated with that word line. If there are no defective cells on a word line, write operation is not conducted and the Y address for each word line at that time is set to initial data such as all 0s. If there are no defects on each word line, therefore, a defect cell is regarded as present in an address corresponding to all 0s of the Y address signal and a redundant circuit is selected in place of the regular circuit.

Alternatively, one-bit flag may be added to the Y address to be stored. It is possible to indicate that the stored Y address is a faulty address by writing "1" into this bit. In this case, the output signal of the comparator CMP 37 is made effective only when the flag outputted from the ROM 36 is "1." By doing so, a defective cell is prevented from being regarded as present in an address corresponding to initial data of memory elements of the ROM 36 in case there are no defects on each word line.

The selector 38 selectively inhibits the Y address signal inputted from the Y address buffer YAB 32 from being inputted to the regular Y decoder circuit YDEC 34. That is to say, if a coincidence signal is outputted by the comparator CMP 37, the selector SEL 38 inhibits the Y address signal from being inputted to the regular Y decoder circuit YDEC 34. By the above described coincidence signal of the comparator CMP 37, the redundant Y selection circuit RYDEC 39 is activated to generate a selection signal of a complementary data line for redundancy.

If in FIG. 1 random defect cells are present in positions represented by black dots, corresponding word lines within the ROM are specified by word lines (X addresses) having defect cells thereon. Y addresses on the word lines are thus stored. By adopting such a configuration, storage of a Y address having 12 bits suffices for one defective cell even in a dynamic RAM having a large storage capacity such as approximately 16 Mbits as described above. In case of a dynamic RAM as described above, the number of X-system addresses is approximately 4K. As for the ROM, therefore, a storage capacity of 4K×12=48 Kbits suffices.

Under the condition that up to one defective cell is present on approximately 4K word lines as described above, as many as approximately 4K defective bits at most can be relieved by using only the ROM 36 having a storage capacity of 48Kbits as described above, one comparator CMP 37 for conducting comparison operation of 12 bits, the redundant selection circuit RYDEC 39, and redundant cells of one column corresponding to the RYDEC 39. That is to say, random cells existing on respective word lines can be replaced by redundant cells arranged on one line and selected by the redundant selection circuit RYDEC 39 as shown in FIG. 1. By employing such a method of specifying faulty addresses, it becomes possible to simplify the memory circuit for specifying random defective cells and significantly simplify the comparator for detecting access to defective cells.

Preferably, the above described ROM 36 is used to divide the X address of the dynamic RAM into the X address and Y address for the ROM and gain access to storage elements arranged on the memory array while taking a bit corresponding to the Y address signal of the dynamic RAM as the unit.

Figure 2:
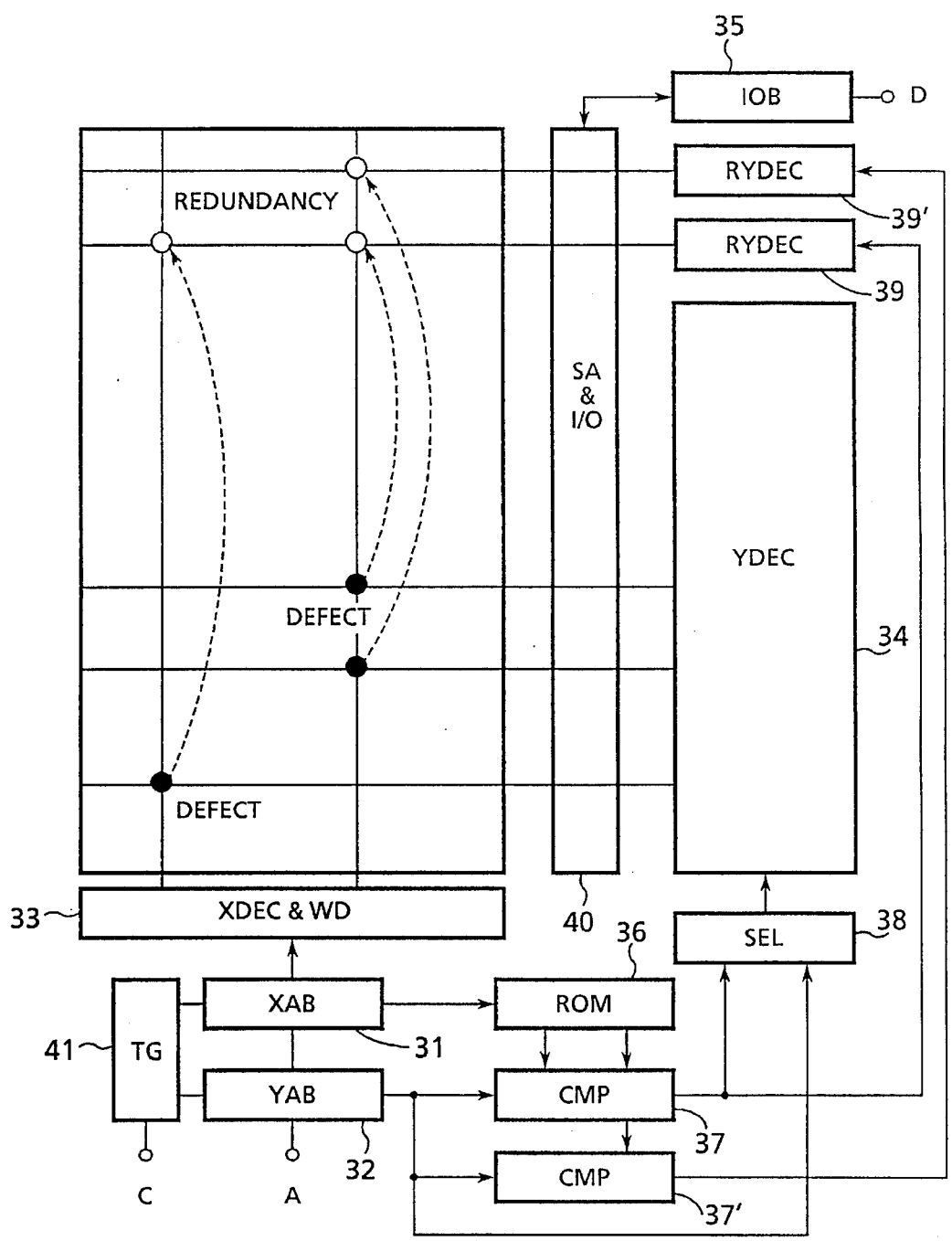
FIG. 2 is a block configuration diagram showing a variant of the embodiment shown in FIG. 1.

FIG. 2 shows the block configuration diagram of a variant with respect to FIG. 1. In this embodiment, two redundant columns are provided so that the case where one word line has two defective cells may also be coped with. In this case, Y addresses of up to two defective cells are stored in the ROM 36 for each word line. The two Y addresses are outputted to two comparators 37 and 37', respectively. The Y address outputted from the Y address buffer YAB 32 is subjected to comparison in these comparators 37 and 37'. According to the result of comparison, two redundant Y selection circuits 39 and 39' are selectively activated to replace defective cells on the word line by redundant cells. If a plurality of redundant columns and a plurality of comparators 37 and redundant Y selection circuits 39 corresponding thereto are thus provided, a plurality of defective cells can be compensated for each word line.

Figure 3:
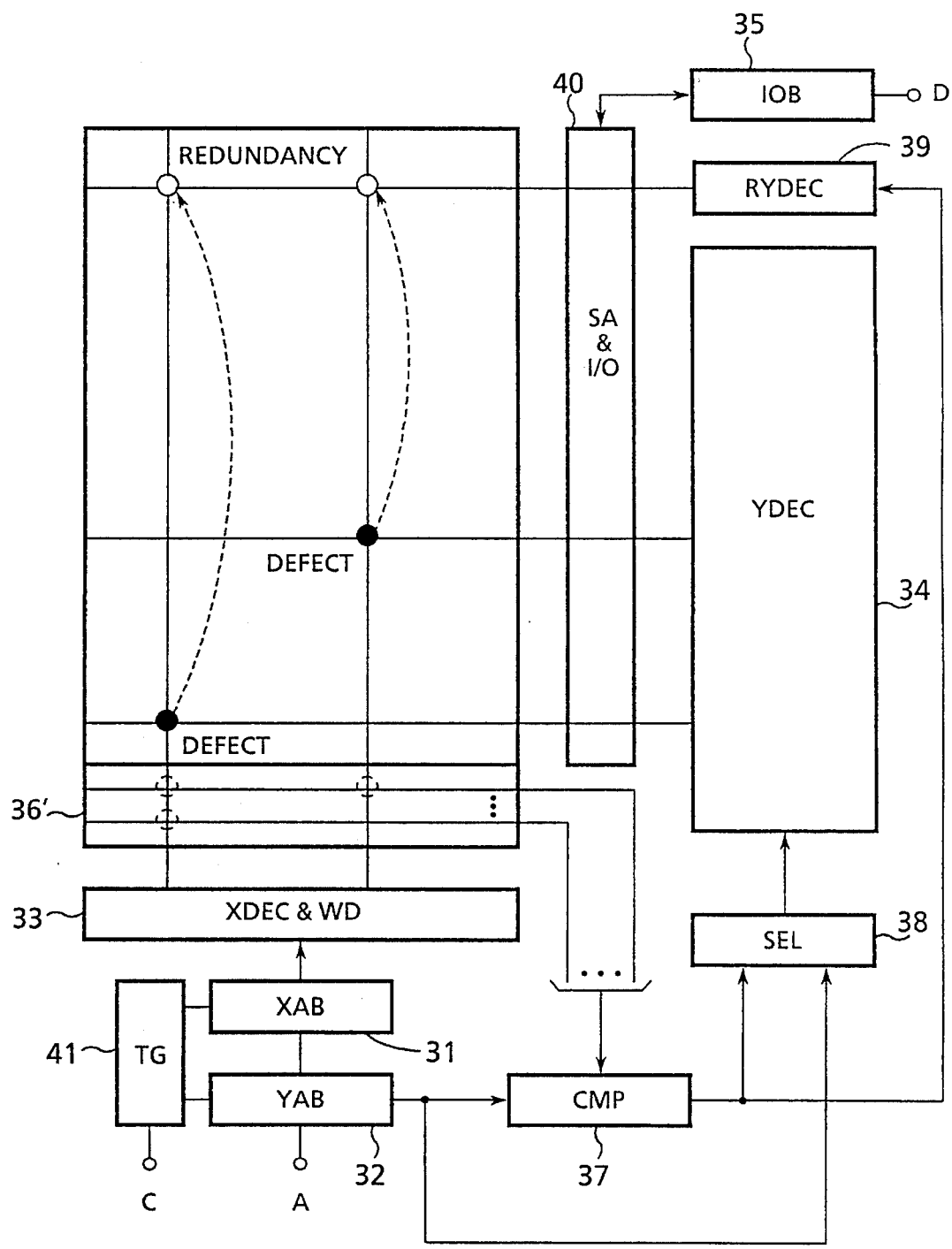
FIG. 3 is a block diagram showing another embodiment of a dynamic RAM having a random defect relieving function according to the present invention.

FIG. 3 shows the block diagram of another embodiment of a dynamic RAM having random defect relieving function according to the present invention. In this embodiment, a ROM 36' is formed so as to be integral with the memory array of the dynamic RAM.

In this embodiment, memory cells forming the ROM 36' are connected to output signals of the X decoder circuit XDEC 33 of the dynamic RAM, i.e., word lines of the dynamic RAM to simplify the ROM. For example, 12 bit lines or data lines are intersected with word lines of the memory array, and storage elements having stacked gate structures which will be described later are provided at the intersections.

Fuse means may also be employed in place of memory storage elements as described above. In case such fuse means are used, word lines are connected to bit lines via unilateral elements including MOSFETs having diode forms. Preferably, fuses are formed by thin wires using an upper conducting layer and selectively cut by irradiation of a laser spot. For example, if a fuse is not cut, the high level of the word line is conveyed to the bit line. If a fuse is cut, a low level is outputted.

In this configuration, access to the ROM 36' is simultaneously conducted by the X-system address selection operation of the dynamic RAM. A signal of 1 and 0 corresponding to faulty Y addresses are outputted from 12 bit lines. This signal is supplied to one input of the comparator CMP 37 as it is and compared with the Y address signal outputted from the Y address buffer YAB 32.

In this configuration, the ROM 36' can be formed on the memory array of the dynamic RAM. Therefore, the address decoder and word line thereof can be shared with the regular circuit of the dynamic RAM. As a result, the occupied area of the ROM 36' can be significantly reduced. If two or more defective cells on one word line are to be relieved as described above, it can be done by increasing the number of bit lines and the comparators as described above according to the number of defective cells to be relieved.

Figure 4:
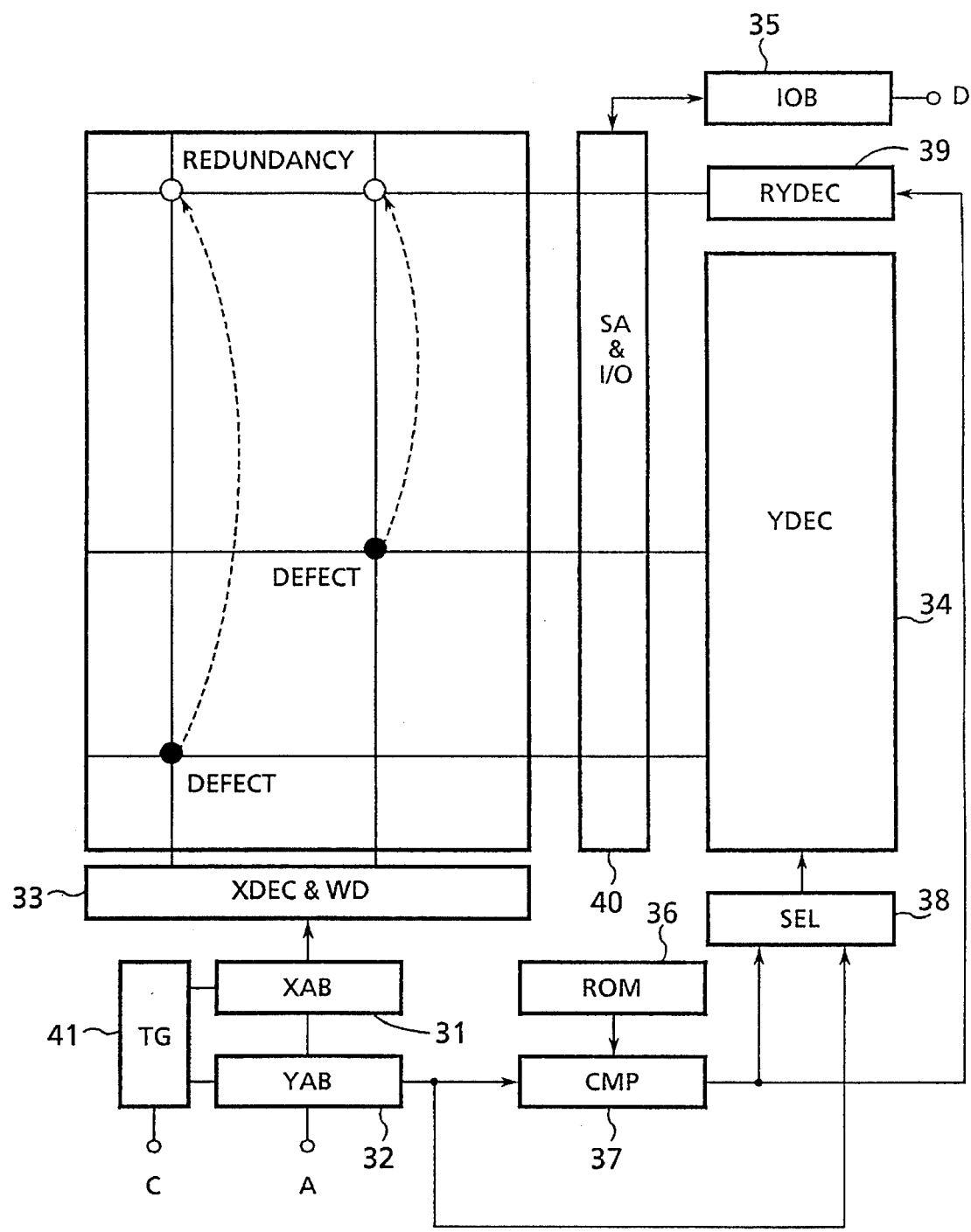
FIG. 4 is a block diagram showing a further embodiment of a dynamic RAM having a random defect relieving function according to the present invention.

FIG. 4 shows the block diagram of a further embodiment of a dynamic RAM having random defect relieving function according to the present invention. In this embodiment, only output signals of the X decoder circuit XDEC 33 of the dynamic RAM are shared. If word lines are also shared as in the embodiment of FIG. 3, disadvantage such as increase of the load of the word lines of the dynamic RAM by that amount might occur in some cases.

In this embodiment, therefore, only address decode signal is taken out and supplied to a ROM array provided separately from the memory array of the dynamic RAM as a selection signal of the ROM 36. In case the X-system address decode circuit is formed by a plurality of logical stages, respective predecode signals may be supplied to the ROM 36 so that address selection operation may be conducted by a simple decode circuit disposed on the ROM side. In case two or more defective cells on one word line are to be relieved as described above, it can be done by increasing the number of ROMs and comparators CMPs according to the number of defect cells to be relieved.

Figure 5:
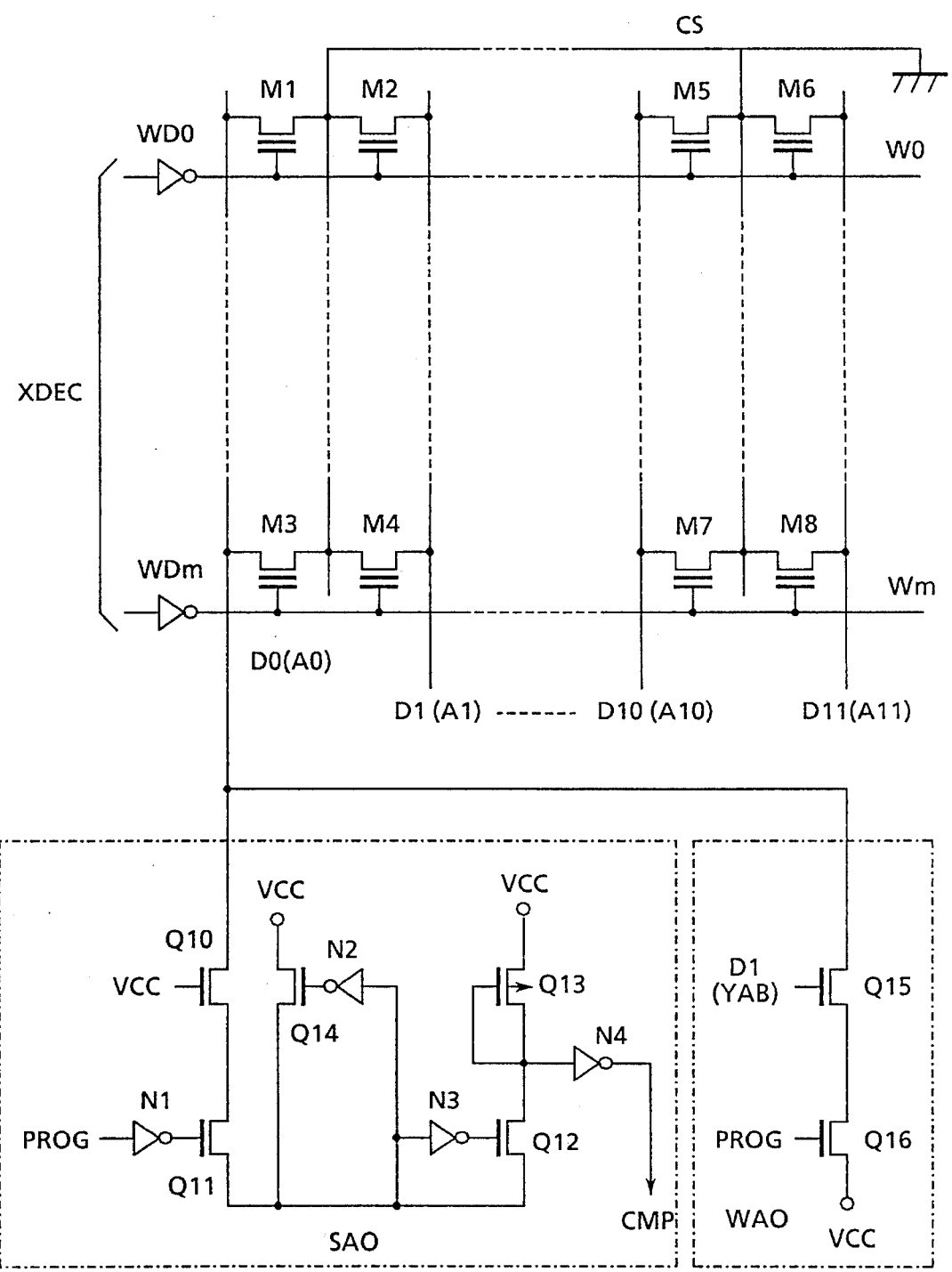
FIG. 5 is a circuit diagram showing an embodiment of a ROM used to store faulty addresses.

FIG. 5 shows the circuit diagram of an embodiment of the above described ROM storing faulty addresses of Y system. In FIG. 5, a P-channel MOSFET is discriminated from N-channel MOSFETs by addition of an arrow to its channel (backgate) portion.

As for the memory array of the ROM, eight memory cells M1 to M8 are illustrated as representative examples. That is to say, the memory array is formed by exemplified memory cells (nonvolatile memory elements MOSFET M1 to M8) of stacked gate structure having a control gate and a floating gate, word lines W0 to Wm, and data lines D0, D1 to D10, and D11. In case such a memory cell having a stacked gate structure is employed, it can be formed with a size equivalent to or smaller than that of a memory cell of the dynamic RAM, and hence the ROM can be incorporated into the memory array of the regular circuit as shown in FIG. 3.

In the above described exemplified memory array, control gates of the memory cells M1, M2, M5 and M6 disposed on the same row are connected to a corresponding word line W0, and control gates of the memory cells M3, M4, M7 and M8 disposed on the same row are connected to a corresponding word line Wm. Word lines W0 to Wm are driven by word drivers WD0 to WDm. The word lines W0 to Wm may be shared with the word lines of the regular memory array of the dynamic RAM as shown in FIG. 3. Or the output signal of the X-system decoder circuit XDEC may be supplied to the word drivers WD0 to WDm as shown in FIG. 4.

Drains of the memory cells M1 and M3 disposed on the same column are connected to a corresponding data line D0. Drains of the memory cells M2 and M4 disposed on the same column are connected to a corresponding data line D1. Drains of the memory cells M5 and M7 disposed on the same column are connected to a corresponding data line D10. Drains of the memory cells M6 and M8 disposed on the same column are connected to a corresponding data line D11. Sources of the memory cells M1 to M8 are connected to a common source line CS.

Preferably in this embodiment, write/read operation is conducted by taking a plurality of bits such as 12 bits corresponding to Y-system address signals A0 to A11 as the unit. As for the memory array of the ROM, the X-system address in the dynamic RAM may be distributed to the X address and Y address of the ROM address.

If the number of data lines forming the memory array of the ROM is large such as 12×N, a column switch may be provided to connect data lines to common data lines corresponding to faulty Y addresses. Selection operation of 1/N is conducted by using the decode output of address signals distributed to the Y address.

In case of RAM of 16 Mbits, for example, each of X and Y lines has 12 lines and the number of word lines becomes $2^{12}$=4096. If addresses of the RAM are simply associated with addresses of the ROM as they are, the number of word lines of the ROM also becomes 4096. In this case, the capacity of data lines becomes very large, and problems such as long access time and large power dissipation might be caused. Therefore, nine lines, for example, among 12 lines of the X address of the RAM may be assigned to the X address of the ROM and three remaining lines may be assigned to the Y address of the ROM to perform decoding.

With the advance of semiconductor techniques, the element size tends to become small and the thickness of insulating film tends to become thin. With the advance of such reduction in element size and film thickness, the voltage itself needed for write operation to nonvolatile memory elements each having a stacked gate structure may be made small.

In this embodiment, write voltage applied to drains of memory cells is as low as approximately 5 to 6 V. That is to say, instead of VPP providing voltage as high as approximately 12 V as in conventional EPROMs using conventional nonvolatile memory elements of stacked gate structure, supply voltage having a value of approximately 5 to 6 V such as VCC is used as the write voltage. That is to say, as for the dynamic RAM, low operation voltage such as 3.3 V is generated by using a level converter circuit. In write operation to the ROM, however, the address signal specifying faulty addresses may be conveyed to the ROM as the signal of 5 V system without being subjected to level conversion.

In this case, boost voltage raised to at least VCC+Vth (where Vth is threshold voltage of MOSFET Q15 and Q16) is used as control signal PROG and write data Di supplied to gates of the MOSFET Q15 and Q16 forming a write load circuit. Thus the effective threshold voltage of the MOSFET Q15 and Q16 does not cause level drop in the VCC. If P-channel MOSFETs are used as the MOSFET Q15 and Q16 when VCC is to be supplied to data lines as write voltage, a CMOS circuit of 5 V system can be used for the Y address signal as the control signal PROG and write data Di as well.

The above described data line D0 is coupled to an input terminal of an input stage circuit of a sense amplifier SA0 via MOSFET Q10 and a switch MOSFET Q11 provided for taking partial charge of the write voltage. A circuit formed by MOSFETs Q12 to Q14 for conducting amplifying operation at the input stage, inverter circuits N2 and N3 for controlling them, and a CMOS inverter circuit N4 is herein referred to as sense amplifier SA0. The MOSFET Q11 is controlled by the output signal of the inverter circuit N1 which receives the control signal PROG. At the time of write operation, the MOSFET Q11 is in the off-state. This prevents relatively high potential of the data line D0 at the time of writing from being supplied to the input of the sense amplifier SA0.

As for the switch MOSFET Q11 and MOSFETs forming the sense amplifier, the gate insulating film is made thin with the advance of fineness in elements. Since the switch MOSFET Q11 is formed by using a MOSFET having the same gate insulating film as that of the MOSFET forming such a peripheral circuit, voltage of 5 V to 6 V or so is directly applied even if the write voltage is made relatively low as described above. Therefore, the MOSFET Q10 is inserted in series and supply voltage VCC is steadily supplied to the gate thereof. Thereby, the MOSFET Q10 and Q11 take partial charge of the above described write voltage to substantially raise the breakdown voltage.

In the read operation, the storage level read out on the data line D0 is coupled to the source of the amplifying MOSFET Q12 of N channel type via the MOSFET Q10 steadily held in the on-state and the MOSFET Q11 turned on at the time of readout and whose source is connected to the source of the MOSFET Q12. Between the drain of this amplifying MOSFET Q12 and a supply voltage terminal VCC, a load MOSFET Q13 of P-channel type having a gate and a source connected together is provided. The load MOSFET 13 functions to let flow a precharge current through the data line in order to conduct the read operation.

In order to raise the sensitivity of the amplifying MOSFET Q12, the readout input signal is supplied to inputs of the inverter circuits N2 and N3 functioning as inverting amplifier circuits. The output signal of the inverter circuit N3 functioning as the inverting amplifier circuit is supplied to the gate of the amplifying MOSFET Q12. The above described source input is subjected to charge up from the supply terminal VCC via the MOSFET Q14 functioning as a limiter. The output signal of the inverter circuit N2 functioning as the inverting amplifier circuit is supplied to the gate of the MOSFET Q14.

At the time of memory cell readout, the memory cell has threshold voltage higher than the selection level of the word line or threshold voltage lower than the selection level according to the information charge stored in the floating gate. In case the selected memory cell is held in the off-state though the word line is at the selection level, the data line D0 is raised to a relatively high level by current supply from the MOSFETs Q12 and Q14. On the other hand, in case the selected memory cell is held in the on-state by the word line selection level, the data line D0 is at a relatively low level.

In this case, the high level of the data line D0 is limited to relatively low potential because the output voltage of a relatively low level formed by the inverting amplifier circuit receiving the potential of this high level is supplied to the gate of the MOSFET Q14. On the other hand, the low level of the data line D0 is limited to a relatively high potential because the voltage of a relatively high level formed by the inverting amplifier circuit receiving the potential of this low level is supplied to the gate of the MOSFET Q14. By such level limiting action of the data line D0, it becomes possible to substantially increase the signal change speed when the storage information consecutively read out from memory cells changes from the "1" level to the "0" level or when the storage information changes from the "0" level to the "1" level.

The amplifying MOSFET Q12 conducts amplifying operation of common gate and source input type and conveys its output signal to the input of the CMOS inverter circuit N4. The CMOS inverter circuit N4 applies waveform shaping to the drain output signal of the amplifying MOSFET Q12 and conveys it to a corresponding comparator CMP.

Faulty address writing is conducted by injecting hot carriers, which are generated by supplying the high voltage (VCC) to drain connected to the data line, into the floating gate in the same way as the memory cell of the EPROM. By the write operation, the threshold voltage seen from the word line whereto the control gate of the memory cell is connected becomes high. Alternatively, a high electric field may be generated between the floating gate and drain to store electrons in the floating gate by using the tunnel phenomenon through a thin oxide film.

Figure 7:
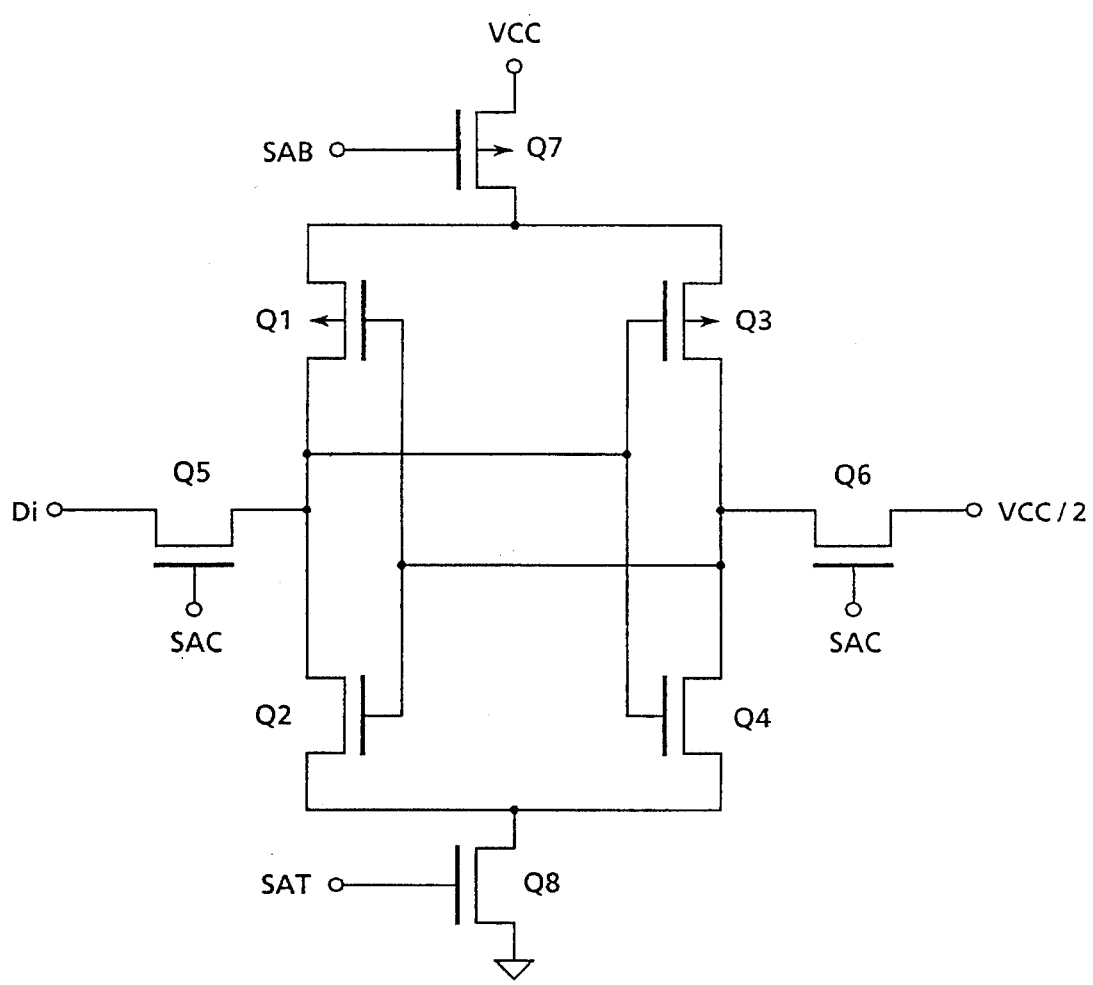
FIG. 7 is a circuit diagram showing another embodiment of a sense amplifier used in the ROM of FIG. 5.

FIG. 7 shows the circuit diagram of another embodiment of the above described sense amplifier.

In this embodiment, a sense amplifier similar to the sense amplifier used in the dynamic RAM is used. That is to say, inputs and outputs of CMOS inverter circuits respectively formed by P-channel MOSFETs Q1 and Q3 and N-channel MOSFETs Q2 and Q4 are mutually connected to form a latch. Between sources of the P-channel MOSFETs Q1 and Q3 and the supply voltage VCC, a P-channel MOSFET Q7 functioning as a power switch is disposed. The MOSFET Q7 is subjected to switch control by a sense amplifier activation signal SAB. Between sources of the N-channel MOSFETs Q2 and Q4 and the ground potential point of the circuit, an N-channel MOSFET Q8 functioning as a power switch is disposed. The MOSFET Q8 is subjected to switch control by a sense amplifier activation signal SAT. As for the sense amplifier activation signal SAB, its low level is the active level. The SAT is a complementary signal, the high level of which is the active level.

An input signal Di and reference voltage VCC/2 are supplied to a pair of inputs of the above described sense amplifier via switch MOSFETs Q5 and Q6. A sense amplifier control signal SAC having a high level in the readout mode is supplied to gates of these switch MOSFETs Q5 and Q6. These MOSFETs Q5 and Q6 are provided when needed mainly as measures for breakdown voltage. If there are no problems in breakdown voltage with respect to write voltage, the MOSFETs Q5 and Q6 can be omitted.

A suitable bias circuit or load circuit is provided so that the data line may assume a voltage somewhat higher than VCC/2 at the input of the sense amplifier when the storage information of the storage MOSFET is in the off-state, whereas the data line may assume a voltage lower than VCC/2 when the storage information of the storage MOSFET is in the on-state. In FIG. 3, SA can also be shared.

Effects obtained from the above described embodiments will now be described. That is to say, access is performed by using the X-system address. There is provided a ROM, in which the Y-system address signal having a defect cell is electrically written. The readout signal of the ROM is compared with the Y-system address signal. Upon coincidence, a Y-system redundant circuit is selected in place of the Y-system regular circuit. Thereby, the ROM stores only the Y-system address signal having a defect, and hence the number of elements can be reduced. Since the comparator circuit makes comparison of only Y-system addresses and it can be used in common for all addresses of the Y system, the circuit scale can be significantly reduced, thereby resulting in an improvement.

By using nonvolatile memory elements of a stacked gate structure each having a control gate and a floating gate and storing charge depending upon storage information in the floating gate, a cell can be formed with a size nearly equivalent to or smaller than that of a dynamic memory cell. Therefore, an effect that the ROM can be simplified is obtained.

By forming, as the above described ROM, the nonvolatile memory element on the memory array of the regular circuit so as to be adjacent to the address selection circuit of X-system, an effect that the circuit can be significantly reduced is obtained.

By application to a dynamic RAM whereto the X-system address signal and the Y-system address signal are inputted in time series, changeover from the regular circuit to the redundant circuit is made using input time difference between the X-system address signal and the Y-system address signal. This results in an effect that the operation speed can be raised.

Heretofore, the invention made by the present inventors has been concretely described on the basis of embodiments. However, the present invention is not limited to the above described embodiments, but various modifications may be made without departing from the spirit of the present invention. For example, "dynamic RAM" means a RAM using dynamic memory cells as memory cells. It is a matter of course that a RAM called quasi-static RAM and provided with compatibility to a static RAM in input-output interface and a RAM intended to specific application such as image processing and provided with serial input-output function in the input-output section are also included in the dynamic RAM.

The present invention can be applied to various semiconductor memory devices such as static RAMs and EPROMs besides the above described dynamic RAMs. In application to EPROMs, a light shield film made of aluminium or the like is formed on the surface of a portion having faulty address stored therein to disable erasing caused by ultraviolet radiation.

The effects obtained by the embodiments heretofore described will now be described briefly. That is to say, access is performed by using the X-system address. There is provided a ROM, in which the Y-system address signal having a defect cell is electrically written. The readout signal of the ROM is compared with the Y-system address signal. Upon coincidence, a Y-system redundant circuit is selected in place of the Y-system regular circuit. Thereby, the ROM stores only the Y-system address signal having a defect, and hence the number of elements can be reduced. Since the comparator circuit makes a comparison of only Y-system addresses and it can be used in common for all addresses of the Y system, the circuit scale can be significantly reduced.

We claim:

1. A semiconductor memory device comprising:

a plurality of word lines;

a plurality of data lines;

a first redundant data line;

a plurality of memory cells each of which is coupled to a corresponding one of said plurality of word lines and a corresponding one of said plurality of data lines;

a plurality of first redundant memory cells each of which is coupled to said first redundant data line and a corresponding one of said plurality of word lines;

a first decoder receiving a plurality of first address signals and selecting one of said plurality of word lines in accordance with said plurality of first address signals;

a defect address signal storing circuit receiving address signals from only said plurality of first address signals and outputting a plurality of first defect address signals corresponding to said first address signals;

a first comparing circuit receiving a plurality of second address signals and said plurality of first defect address signals and deciding whether or not said plurality of first defect address signals are coincident with said plurality of second address signals; and a second decoder selecting one of said plurality of data lines in accordance with said plurality of second address signals when said first comparing circuit decides that said plurality of first defect address signals are not coincident with said plurality of second address signals and selecting said first redundant data line when said first comparing circuit decides that said plurality of first defect address signals are coincident with said plurality of second address signals.

2. A semiconductor memory device according to claim 1, wherein each one of said plurality of memory cells and each one of said plurality of first redundant memory cells is a dynamic memory cell.

3. A semiconductor memory device according to claim 2, 
   wherein said plurality of first address signals are X address signals, and
   wherein said plurality of second address signals are Y address signals.

4. A semiconductor memory device according to claim 3, further comprising:

external address terminal receiving external X address signals and external Y address signals;

an X address buffer coupled to said external address terminals, receiving said external X address signals and outputting said X address signals; and a Y address buffer coupled to said external address terminals, receiving said external Y address signals and outputting said Y address signals.

5. A semiconductor memory device according to claim 4, further comprising a selector receiving said plurality of second address signals, outputting said plurality of second address signals to said second decoder when said first comparing circuit decides that said plurality of first defect address signals are not coincident with said plurality of second address signals, and inhibiting said plurality of second address signals from being inputted to said second decoder when said first comparing circuit decides that said plurality of first defect address signals are coincident with said plurality of second address signals.

6. A semiconductor memory device according to claim 5,
   wherein said first comparing circuit outputs coincidence signals when said plurality of first defect address signals are coincident with said plurality of second address signals, and
   wherein said second decoder selects said first redundant data line when said second decoder receives said coincidence signals.

7. A semiconductor memory device according to claim 1, further comprising:

a second redundant data line;

a plurality of second redundant memory cells each of which is coupled to said second redundant data line and a corresponding one of said plurality of word lines; and a second comparing circuit, wherein said defect address signal storing circuit further outputs a plurality of second defect address signals corresponding to said plurality of first address signals, wherein said second comparing circuit receives said plurality of second address signals and said plurality of second defect address signals and decides whether or not said plurality of second defect address signals are coincident with said plurality of second address signals, wherein said second decoder selects said second redundant data line when said second comparing circuit decides that said plurality of second defect address signals are coincident with said plurality of second address signals, and wherein said second decoder selects one of said plurality of data lines when said first comparing circuit decides that said plurality of first defect address signals are not coincident with said plurality of second address signals and said second comparing circuit decides that said plurality of second defect address signals are not coincident with said plurality of second address signals.

8. A semiconductor memory device according to claim 7, wherein said plurality of first address signals designate one of said plurality of word lines, wherein said plurality of first defect address signals designate a first one of said plurality of data lines, a first defect memory cell being coupled to said first one of said plurality of data lines and one of said plurality of word lines, and wherein said plurality of second defect address signals designate a second one of said plurality of data lines, a second defect memory cell being coupled to said second one of said plurality of data lines and one of said plurality of word lines.

9. A semiconductor memory device comprising:

a plurality of word lines;

a plurality of data lines;

a first redundant data line;

a plurality of memory cells each of which is coupled to a corresponding one of said plurality of word lines and a corresponding one of said plurality of data lines;

a plurality of first redundant memory cells each of which is coupled to said first redundant data line and a corresponding one of said plurality of word lines;

a defect address signal storing circuit receiving address signals from only a plurality of first address signals and outputting a plurality of first defect address signals corresponding to said plurality of first address signals; and a first comparing circuit receiving a plurality of second address signals and said plurality of first defect address signals and deciding whether or not said plurality of first defect address signals are coincident with said plurality of second address signals;

wherein one of said plurality of word lines is selected in accordance with said plurality of first address signals, wherein one of said plurality of data lines is selected in accordance with said plurality of second address signals when said first comparing circuit decides that said plurality of first defect address signals are not coincident with said plurality of second address signals, and wherein said first redundant data line is selected when said first comparing circuit decides that said plurality of first defect address signals are coincident with said plurality of second address signals.

10. A semiconductor memory device according to claim 9, wherein each one of said plurality of memory cells and each one of said plurality of first redundant memory cells is a dynamic memory cell.

11. A semiconductor memory device according to claim 10, wherein said plurality of first address signals are X address signals, and wherein said plurality of second address signals are Y address signals.

12. A semiconductor memory device according to claim 9, further comprising:

a second redundant data line;

a plurality of second redundant memory cells each of which is coupled to said second redundant data line and a corresponding one of said plurality of word lines; and a second comparing circuit, wherein said defect address signal storing circuit further outputs a plurality of second defect address signals corresponding to said plurality of first address signals, wherein said second comparing circuit receives said plurality of second address signals and said plurality of second defect address signals and decides whether or not said plurality of second defect address signals are coincident with said plurality of second address signals, wherein said second redundant data line is selected when said second comparing circuit decides that said plurality of second defect address signals are coincident with said plurality of second address signals, and wherein said one of said plurality of data lines is selected in accordance with said plurality of second address signals when said first comparing circuit decides that said plurality of first defect address signals are not coincident with said plurality of second address signals and said second comparing circuit decides that said plurality of second defect address signals are not coincident with said plurality of second address signals.

13. A semiconductor memory device according to claim 12, wherein said plurality of first address signals designate one of said plurality of word lines, wherein said plurality of first defect address signals designate a first one of said plurality of data lines, a first defect memory cell being coupled to said first one of said plurality of data lines and one of said plurality of word lines, wherein said plurality of second defect address signals designate a second one of said plurality of data lines, a second memory cell being coupled to said second one of said plurality of data lines and one of said plurality of word lines.

14. A semiconductor memory device according to claim 9, wherein said plurality of first address signals designate one of said plurality of word lines, and wherein said plurality of first defect address signals designate one of said plurality of data lines, a defect memory cell being coupled to said one of said plurality of word lines and said one of said plurality of data lines.

15. A semiconductor memory device according to claim 1, wherein said plurality of first address signals designate one of said plurality of word lines, and wherein said plurality of first defect address signals designate one of said plurality of data lines, a defect memory cell being coupled to said one of said plurality of word lines and said one of said plurality of data lines.

* * * * *